US012592706B2

(12) United States Patent
Bastin et al.

(10) Patent No.: US 12,592,706 B2
(45) Date of Patent: Mar. 31, 2026

(54) METHOD FOR MANUFACTURING A MAGNETRON CAVITY FOR ATOMIC CLOCKS

(71) Applicant: UNIVERSITÉ DE LIÈGE, Liège (BE)

(72) Inventors: Thierry Bastin, Ougrée (BE); Emeline Van Der Beken, Liège (BE)

(73) Assignee: UNIVERSITÉ SE LIÉGE, Liége (BE)

( * ) Notice: Subject to any disclaimer, the term of this patent is extended or adjusted under 35 U.S.C. 154(b) by 0 days.

(21) Appl. No.: 18/697,894

(22) PCT Filed: Oct. 7, 2022

(86) PCT No.: PCT/EP2022/077947
§ 371 (c)(1),
(2) Date: Apr. 2, 2024

(87) PCT Pub. No.: WO2023/057629
PCT Pub. Date: Apr. 13, 2023

(65) Prior Publication Data
US 2025/0015808 A1      Jan. 9, 2025

(30) Foreign Application Priority Data
Oct. 8, 2021    (BE) .................................. 2021/5787

(51) Int. Cl.
*H03L 7/26*      (2006.01)
*G04F 5/14*      (2006.01)
(52) U.S. Cl.
CPC . *H03L 7/26* (2013.01); *G04F 5/14* (2013.01)
(58) Field of Classification Search
CPC ......................................................... H03L 7/26

USPC ......................................................... 331/94.1
See application file for complete search history.

(56) References Cited

U.S. PATENT DOCUMENTS

| | | | |
|---|---|---|---|
| 4,123,727 A | 10/1978 | Peters | |
| 4,661,782 A | 4/1987 | Weidemann | |
| 5,387,881 A * | 2/1995 | Schweda | H03L 7/26 |
| | | | 331/3 |
| 2015/0358026 A1* | 12/2015 | Gan | H03L 7/26 |
| | | | 331/94.1 |

FOREIGN PATENT DOCUMENTS

CN      103515171 A      1/2014

OTHER PUBLICATIONS

Belgian Search Report from corresponding BE Application No. 202105787, Jun. 24, 2022.
International Search Report from corresponding PCT Application No. PCT/EP2022/077947, Jan. 24, 2023.

(Continued)

*Primary Examiner* — Joseph Chang
(74) *Attorney, Agent, or Firm* — Workman Nydegger

(57)      ABSTRACT

A computer-assisted method for the dimensioning of a magnetron cavity for an atomic clock, in particular for a hydrogen maser, the cavity being substantially cylindrical and including at least two curved electrodes disposed along a circular arc and delimiting a substantially cylindrical space of predetermined radius r, the cavity also including a substantially cylindrical storage bulb of radius rB disposed in said space such that there is a radial interstice ei between the at least two electrodes and the storage bulb.

14 Claims, 5 Drawing Sheets

(56) References Cited

OTHER PUBLICATIONS

Opie, D.B. et al. "A High TC Superconducting Resonator for a Compact Hydrogen Maser" Forty-Fifth Annual Symposium on Frequency Control, May 29-30, 1991, Los Angeles, pp. 467-476.

Pellaton, M. et al. "3D Printed microwave cavity for atomic clock applications: proof of concept" Electronics letters, The Institution of Engineering and Technology, vol. 54, No. 11, May 31, 2018, pp. 691-693.

Chen, Haibo et al. "Paper: A study on the frequency-temperature coefficient of a microwave cavity in a passive hydrogen maser", Metrologia, Institute of Physics Publishing, vol. 49, No. 6, Nov. 21, 2012, pp. 816-820.

Ivanov, Anton E. et al. "Design of atomic clock cavity based on a loop-gap geometry and modified boundary conditions", International Journal of Microwave and Wireless Technologies, vol. 9, No. 7, Jun. 27, 2017, pp. 1373-1386.

* cited by examiner

METHOD FOR MANUFACTURING A MAGNETRON CAVITY FOR ATOMIC CLOCKS

TECHNICAL FIELD OF THE INVENTION

The present invention relates to the field of the magnetron cavities for atomic clocks, in particular for atomic clocks of hydrogen maser type.

STATE-OF-THE-ART

It is known practice to use hydrogen masers as atomic clocks. Out of the current frequency standards, the hydrogen maser has the best short-term stability and is therefore used in many applications such as for example the synchronisation of the radiotelescopes used for long baseline interferometry. This type of atomic clock generally comprises an electromagnetic cavity at the centre of which is situated a storage bulb. Hydrogen atoms are contained in said bulb in order to induce the stimulated emission at 1420.406 MHz between the two hyperfine levels F=0 and F=1 of the fundamental state 1 s1/2 of the hydrogen atom.

However, the hydrogen masers of standard size are bulky and heavy, which poses a problem for, in particular, space applications, for example in the context of a global positioning system, for which the design of compact models is of vital importance. It is known that the dimensions of the cavity dictate the dimensions of the various elements which surround it, essentially a vacuum chamber bell jar, a solenoid and thermal and magnetic shields. Consequently, the only way to obtain a smaller maser design is to reduce the size of the cavity.

In the document U.S. Pat. No. 4,123,727, H. Peters demonstrated the possibility of an atomic clock of reduced size by reducing the size of the cylindrical cavity by virtue of a structure of electrodes which modify the electrical field lines within this cylinder and thus make it possible to modify the resonance frequency. Typically, in this design, the cavity consists of a closed outer metal cylinder surrounding an open inner cylinder with four slits, the four elements of the inner cylinder being called electrodes. The assembly is in a single piece and the storage bulb is placed within the inner cylinder formed by the electrodes. While this principle of cavity of magnetron type is well known, the impact of the geometrical parameters of this cavity on the metrological properties of the clock remains unknown.

It is also known that an important coefficient for the correct operation of such atomic clocks is the so-called frequency-temperature coefficient (FTC), that is to say the coefficient indicating the variation of the resonance frequency of the cavity per unit of temperature variation of the cavity. The FTC of the cavity directly affects the overall stability of the atomic clock. The lower this coefficient is in absolute value, the more stable is the system. The maser cavities of standard size typically have FTC values of the order of 30 kHz° C.$^{-1}$ in absolute value for dimensions of the cavity of the order of approximately 27 cm both in height and in diameter.

In the document CN103515171, Chen et al. suggest magnetron cavities with a lower FTC via the use of different metallic materials for the elements inside the cavity of the magnetron. FTC values as low as 2.5 kHz° C.$^{-1}$ have been predicted. Nevertheless, the method for predicting the FTC proposed by Chen et al. presents several drawbacks. Firstly, the predictability is shown to be insufficient, the experimental results not always being close enough to the theoretical results. Secondly, the predictability is not possible in the presence of the storage bulb within the magnetron cavity. Thirdly, the design of a multi-material cavity is not practical from a machining point of view. It results in an increase in production times and costs.

The present invention therefore aims to at least partially address one or more of the above-mentioned drawbacks. In particular, the objective of the invention is to provide a method for dimensioning a magnetron cavity for an atomic clock, in particular for a hydrogen maser, which allows for the production of a magnetron cavity of reduced size with predictable and optimised stability.

SUMMARY OF THE INVENTION

To this end, a first aspect of the present invention targets a computer-assisted method for dimensioning a magnetron cavity for an atomic clock, in particular for a hydrogen maser. In particular, the magnetron cavity is substantially cylindrical and includes at least two curved electrodes disposed along a circular arc delimiting a substantially cylindrical space of predetermined radius r. The term electrode is understood to mean a metal part which is configured to modify the electrical field lines within this substantially cylindrical space thus making it possible to modify the resonance frequency of the magnetron cavity. The cavity also includes a substantially cylindrical storage bulb of radius r disposed in said space such that there is a radial interstice $e_i$ between the at least two electrodes and the storage bulb. This radial interstice $e_i$ is therefore equal to $r-r_B$, being the radius of the substantially cylindrical space minus the radius of the substantially cylindrical storage bulb.

The computer-assisted dimensioning method comprises the step A of obtaining a set of geometrical parameters of the cavity comprising an initial value of said radial interstice $e_i$, such that the resonance frequency $v_c$ of the cavity at a reference temperature is the required resonance frequency, in particular 1420.406 MHz+/−1 MHz at said reference temperature. These geometrical cavity parameters, such as for example a height and/or a radius of the substantially cylindrical cavity, can on the one hand be dictated by external factors, such as, for example, by the type of application, for example in the case of an atomic clock for a satellite. Also, other geometrical parameters can be varied. The dictated parameters are introduced into a computer program configured to determine, using Maxwell equations, the resonance frequency of the cavity, also called the natural frequency of the cavity, for a set of geometrical parameters and a reference temperature. This step makes it possible to obtain a set of geometrical parameters of the cavity which provides the resonance frequency required at a reference temperature, for example the ambient temperature.

Then, the computer-assisted dimensioning method comprises the step B of determining a potential geometrical deformation of the cavity and determining the resonance frequency associated with said potential deformation, and do so for a plurality of operating temperatures of the clock. This deformation is due to the thermal expansion of the materials. The deformation comprises the deformation of the geometry of the cavity, of the at least two electrodes and of the storage bulb and is based on the known thermal expansion coefficients of the materials used which are introduced into a computer program intended to determine this potential geometrical deformation of the cavity and the associated resonance frequency. The determination of the resonance frequency associated with said potential geometrical deformation can for example be made using the same computer program as in the first step by starting from the deformed geometrics.

The computer-assisted dimensioning method next comprises the step C of determining the frequency-temperature coefficient (FTC) corresponding to the variation of the resonance frequency with respect to said plurality of operating temperatures, in particular by the formula $FTC=\partial v_c/\partial T$. These latter two steps, in particular the step B of determining a potential geometrical deformation of the cavity and determining the resonance frequency associated with said potential deformation, and this for a plurality of operating temperatures of the clock, and the step C of determining the frequency-temperature coefficient (FTC) are then repeated for a plurality of values of said interstice $e_i$ by keeping the same geometrical parameters as determined in the first step inasmuch as the resonance frequency $v_c$ of the cavity is the required resonance frequency, in particular 1420.406 MHz+/−1 MHz. This step D makes it possible to obtain a plurality of FTC values as a function of said interstice $e_i$. Finally, the method comprises the step E of determining the radial interstice $e_i$ corresponding to the desired frequency-temperature coefficient (FTC).

Contrary to the prior art, this computer-assisted method allows for the dimensioning of a magnetron cavity for an atomic clock that has a controllable and predictable coefficient FTC. It therefore becomes possible to obtain magnetron cavities having a relatively low FTC, for example with a value lying between 0 and 60 kHz° $C.^{-1}$, preferably between 0 and 30 kHz° $C.^{-1}$, preferably between 0 and 20 kHz° $C.^{-1}$. The accuracy of the FTC is limited only by the accuracy with which the cavity, the at least two electrodes, and the storage bulb can be machined. This method therefore makes it possible advantageously to optimise the stability of an atomic clock while keeping a control on the resonance frequency of the magnetron cavity. In addition, this method makes it possible to avoid modifying the materials used for the magnetron cavity, the bulb and/or the electrodes, or combining several materials in order to reduce the FTC, as was proposed in the prior art.

The plurality of values of said radial interstice $e_i$ can preferably be chosen between 0 and 3 mm, preferably between 0.1 mm and 2 mm, preferably between 0.2 and 1.2 mm. By dimensioning a magnetron cavity in this way, a predictable and relatively low frequency-temperature coefficient can be obtained. It is moreover preferable to exclude the value 0, corresponding to a storage bulb placed against the at least two electrodes, because this configuration gives a very high frequency-temperature coefficient.

It is preferable for the desired frequency-temperature coefficient (FTC) to be of the order of approximately 20 kHz° $C.^{-1}$ in absolute value or less. Such a coefficient can guarantee a relatively great stability for the magnetron cavity and therefore the atomic clock. At the same time, the method also makes it possible to dimension a magnetron cavity such that it has a greater FTC, if so desired.

Advantageously, said plurality of operating temperatures of the clock can comprise temperatures between approximately 5° C. and 70° C., preferably between 10° C. and 60° C. This plurality of temperatures can for example include the range of temperatures of use of the atomic clock. Depending on the desired accuracy, the repetition of the steps of the method can be done for temperature intervals of for example 5° C. or 1° C. or even 10° C., or any other appropriate temperature interval.

The set of geometrical parameters of the cavity can for example comprise the radius of the substantially cylindrical cavity, the height of said substantially cylindrical cavity, the height and the thickness of the at least two curved electrodes, the radius of the substantially cylindrical space delimited by said at least two electrodes, the height and the radius of said storage bulb. This set of parameters can partly be dictated by external constraints such as, for example, by the use of the magnetron cavity. The constraints dictated by a use of a hydrogen maser in a satellite can for example be different from a use on Earth.

The first step, that is to say the step of obtaining a set of geometrical parameters of the cavity, comprises a determination of the circumferential distance between two adjacent electrodes of the at least two curved electrodes such that the resonance frequency $v_c$ of the cavity at a reference temperature is the required resonance frequency, in particular 1420.406 MHz+/−1 MHz, at said reference temperature. Even though the resonance frequency $v_c$ of a magnetron cavity depends on the set of the geometrical parameters of the magnetron cavity, it has proven possible to adjust this circumferential distance between two adjacent electrodes by keeping the other geometrical parameters fixed in order to make it possible to obtain the required resonance frequency. Since this circumferential distance between two adjacent electrodes is not dictated by external constraints, this determination of the circumferential distance between two adjacent electrodes makes it possible to obtain a required resonance frequency of the magnetron cavity while observing a maximum of dictated geometrical constraints. It is also preferable to include this step of determining the circumferential distance between two adjacent electrodes in the step D) of the method, that is to say in order to re-determine this circumferential distance for each modified interstice $e_i$.

The step B) of the computer-assisted method, in particular the determination of a potential geometrical deformation of the cavity and determination of the resonance frequency associated with said deformation for a plurality of operating temperatures of the clock, can comprise the use of a finite elements method, for example through a finite elements modelling program. This method can make it possible to model a complex structure, to closely follow the geometry that is modelled, without losing sight of the influence of the local effects.

Advantageously, the step C) of the computer-assisted method, in particular the determination of the frequency-temperature coefficient, can comprise a linear regression. This linear regression can for example be performed by the least squares method carried out with the frequency results for each temperature. In particular, this step can be performed graphically by relating the variations of the resonance frequency as a function of the temperature in a graph.

A second aspect of the invention targets a method for manufacturing a magnetron cavity for an atomic clock, in particular for a hydrogen maser. This method can provide one or more advantages cited above.

A third aspect of the invention targets a magnetron cavity for an atomic clock, in particular for a hydrogen maser. This magnetron cavity can provide one or more advantages cited above.

A fourth aspect of the invention targets an atomic clock of hydrogen maser type. This atomic clock of hydrogen maser type can provide one or more advantages cited above.

BRIEF DESCRIPTION OF THE DRAWINGS

A preferred embodiment of the invention will be described with reference to the attached drawings in which

5

Figure 1A:
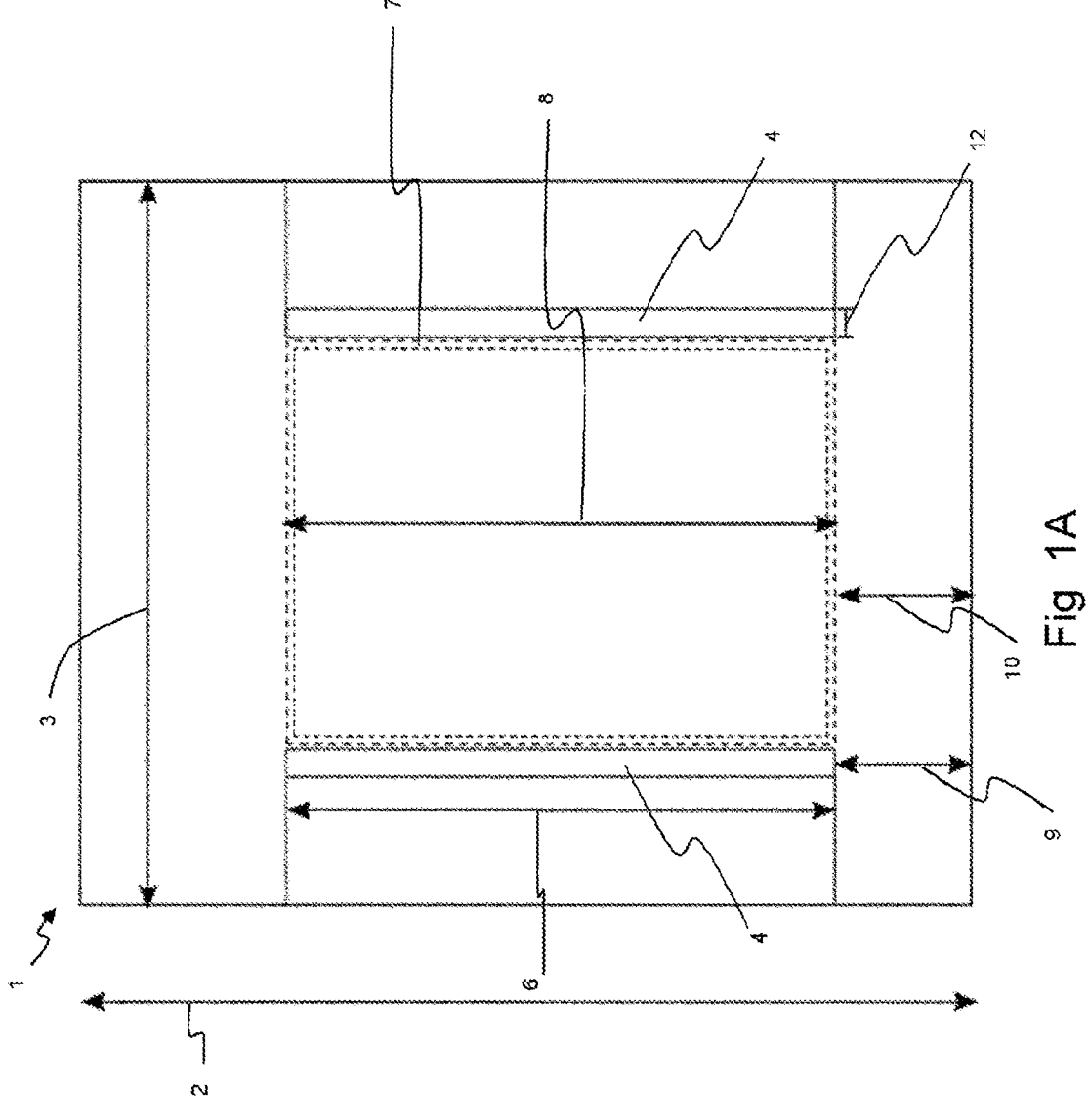
Figure 1B:
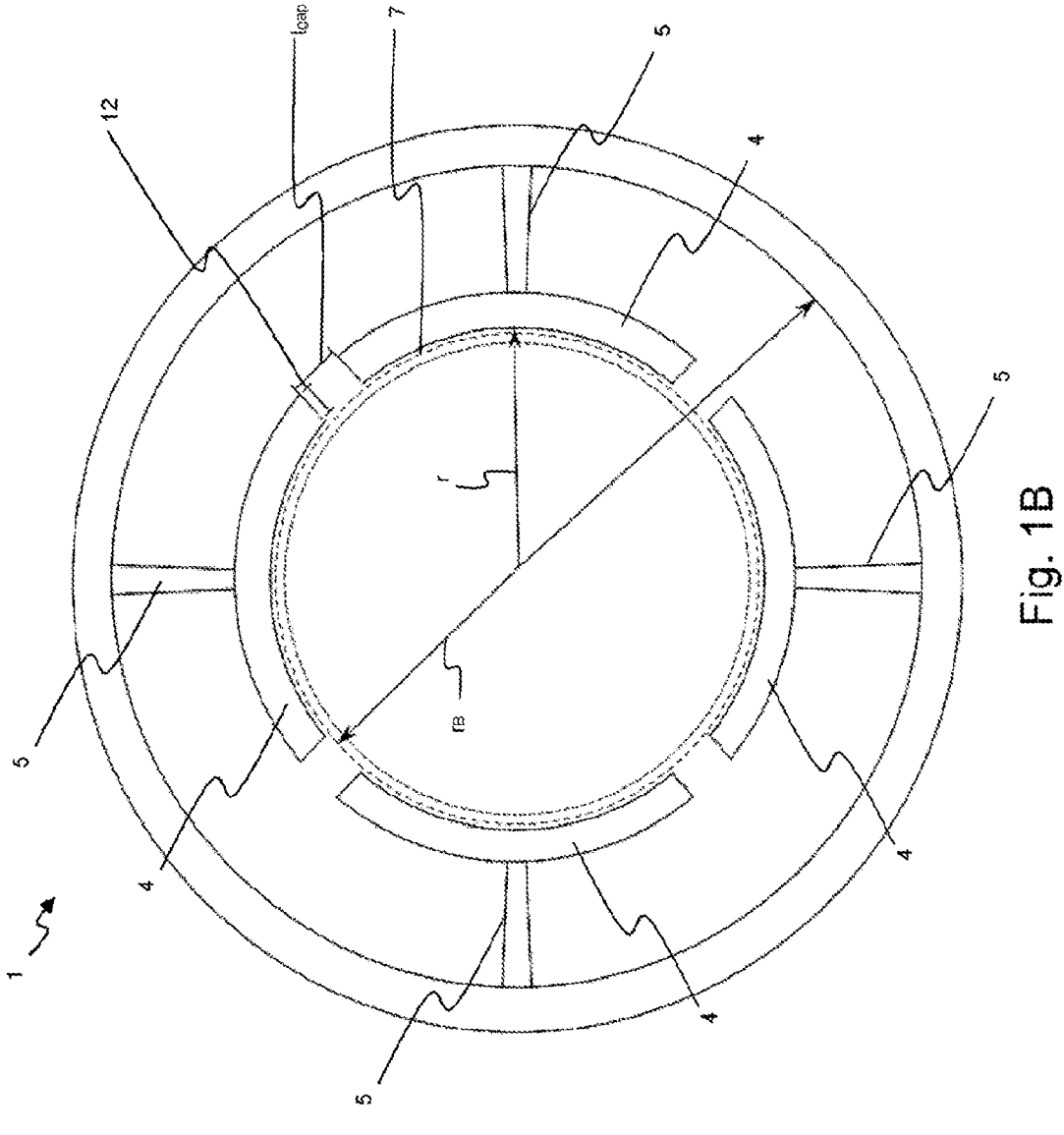
Figure 2:
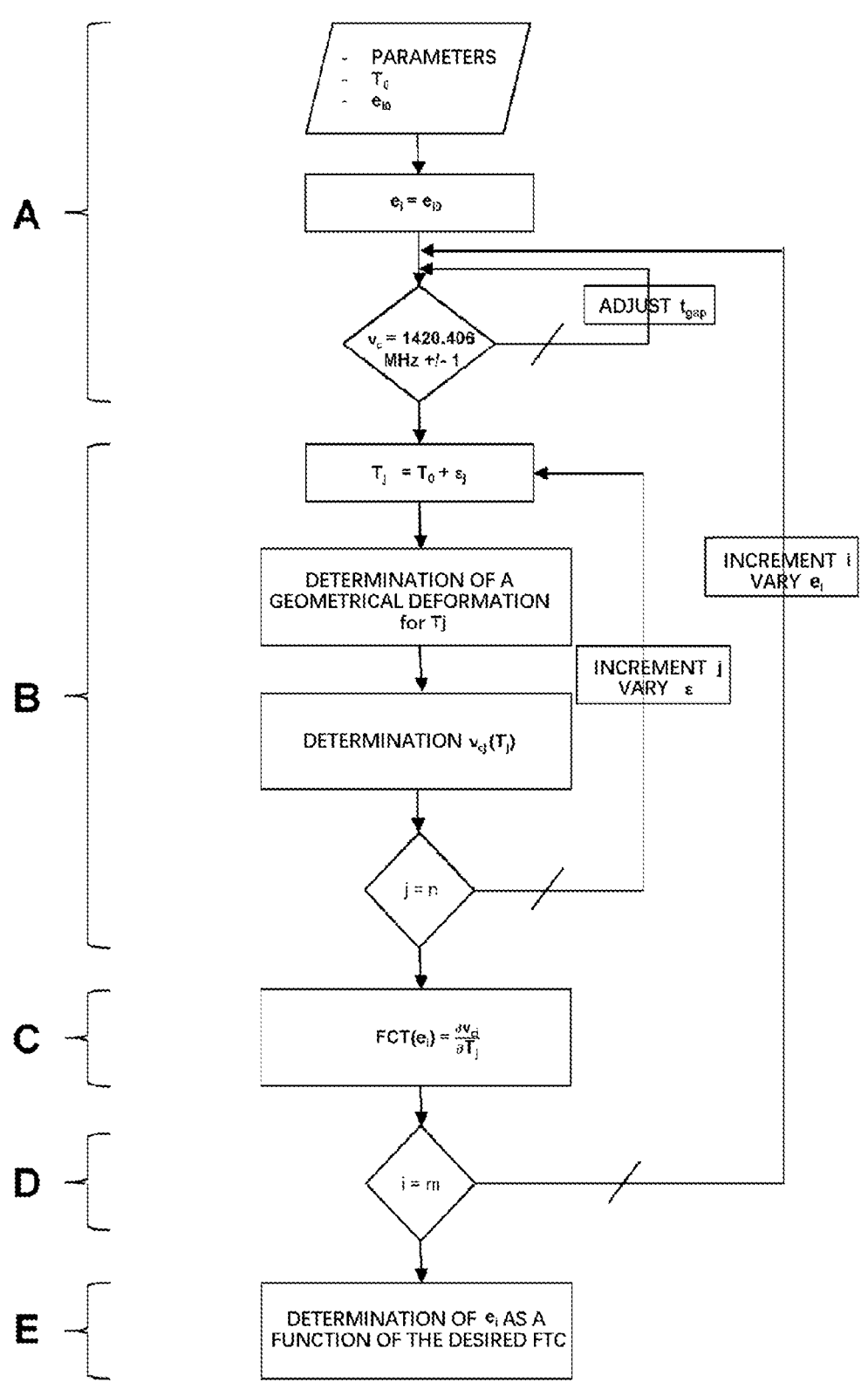
Figure 3:
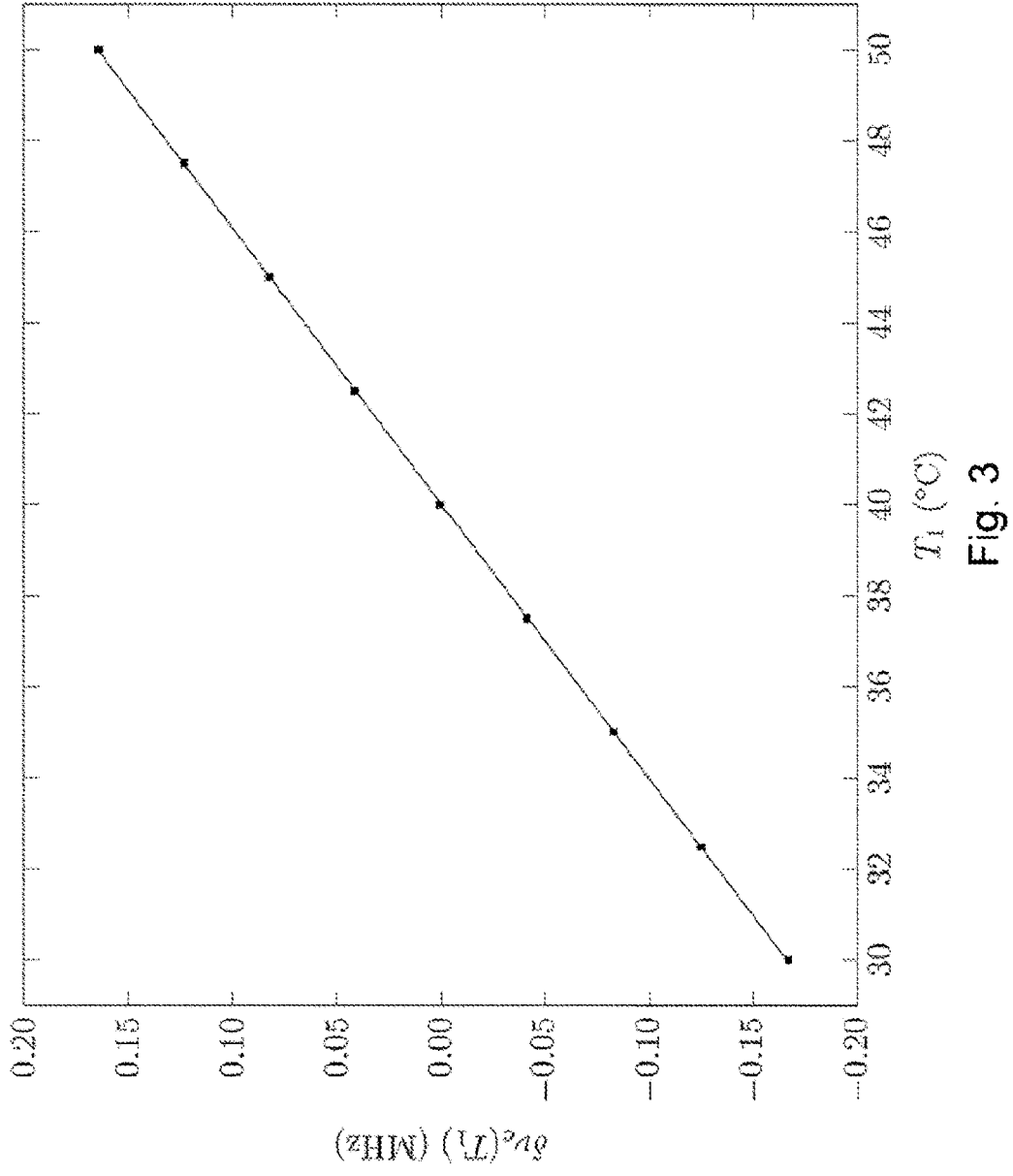
Figure 4:
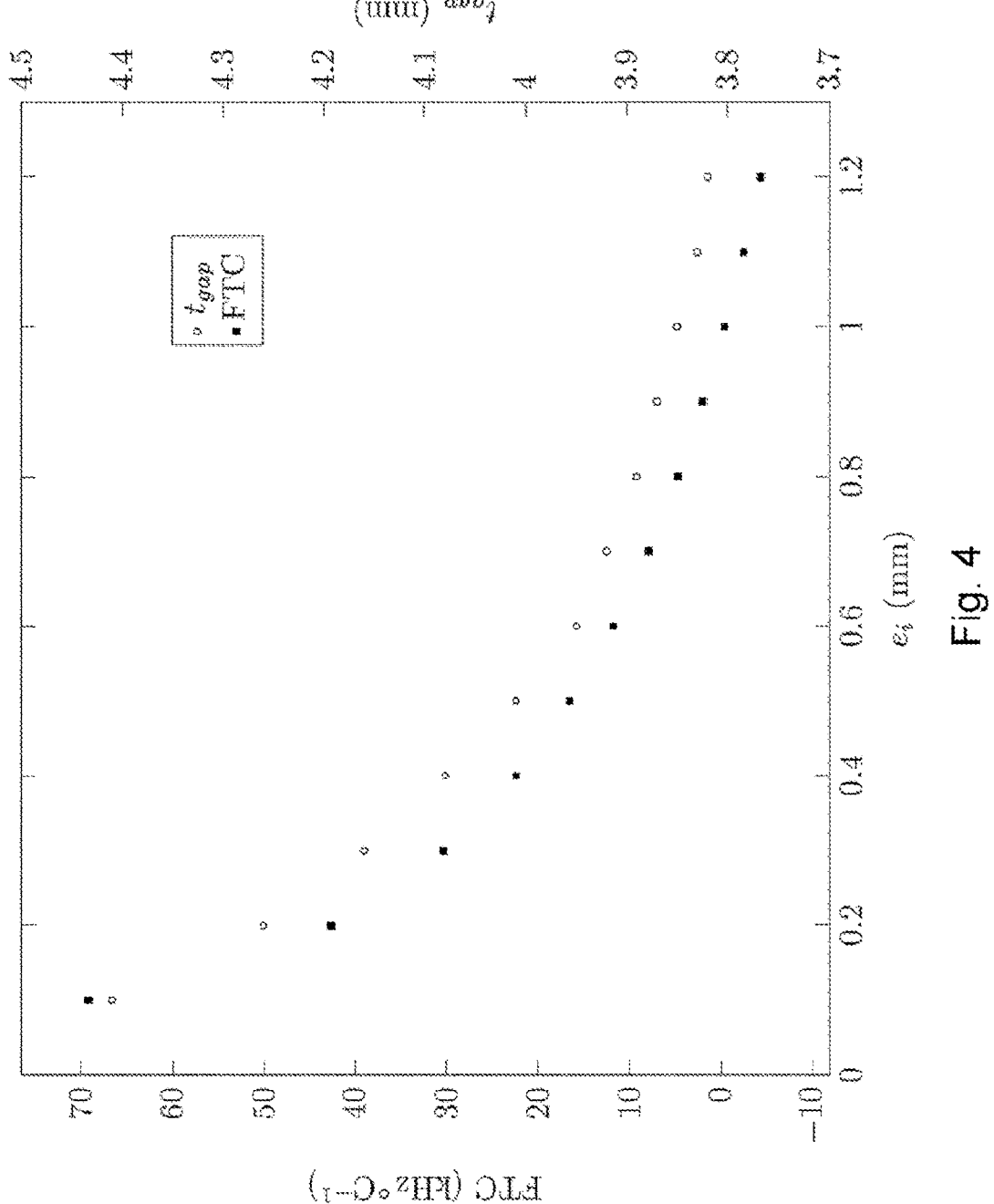

FIG. 1A represents a lateral schematic view of a preferred embodiment of a magnetron cavity according to a second aspect of the invention;

FIG. 1B represents a top schematic view of the magnetron cavity of FIG. 1;

FIG. 2 represents a diagram of a preferred embodiment of a computer-assisted method according to a first aspect of the invention for the dimensioning of a magnetron cavity of FIG. 1A;

FIG. 3 represents a graph illustrating the step C) of the method of FIG. 2;

FIG. 4 represents a graph illustrating the step E) of the method of FIG. 2.

DETAILED DESCRIPTION OF THE INVENTION

FIG. 1A represents a lateral schematic view of a preferred embodiment of a magnetron cavity 1 for an atomic clock, in particular for a hydrogen maser, according to a second aspect of the invention. FIG. 1B represents a top schematic view of said magnetron cavity 1. The magnetron cavity 1 is substantially cylindrical, having a height 2 and a diameter 3 that may be dictated by external constraints such as the space available for the maser, for example in a satellite. A height of the cavity can for example measure between 75 mm and 250 mm, for example between 100 mm and 200 mm, for example approximately 113 mm. The diameter (internal) 3 of the cavity can also vary between for example 75 mm and 200 mm, for example between 100 mm and 150 mm, being preferably approximately 100 mm for a height of approximately 113 mm. The magnetron cavity 1 includes at least two electrodes 4, preferably four electrodes 4, curved and disposed along a circular arc and delimiting a substantially cylindrical space of predetermined radius r. The predetermined radius r is the internal radius of the space delimited by the electrodes. This radius r can for example lie within an interval between approximately 25 mm and approximately 40 mm. These electrodes can be physically connected to the inner wall of the magnetron cavity 1 via supports 5. The electrodes 4 are preferably metal plates, such as copper or aluminum or silver-plated aluminum. They are preferably of the same material as the walls of the cavity 1. A thickness 12 of said electrodes 4 can for example be between 1 and 6 mm, for example around 4 mm. A height 6 of said electrodes 4 is preferably substantially smaller than the height 2 of the magnetron cavity 1 and can for example be approximately 80 mm if the height 2 of the cavity is approximately 113 mm. The electrodes 4 are preferably placed at a distance 9 from the bottom of the magnetron cavity 1. The circumferential distance of the slit between two electrodes 4 is indicated by $t_{gap}$. The magnetron cavity 1 also includes a substantially cylindrical storage bulb 7 (represented by dotted lines) disposed in said substantially cylindrical space formed by the electrodes 4. The bulb 7 has an outer height 8 which is preferably the same as the height 6 of the electrodes 4. The bulb 7 is disposed at a distance 10 from the bottom of the cavity 1, preferably at the same distance as the distance 9 between the electrodes 4 and the bottom of the cavity 1. The bulb 7 has a wall thickness 11 of for example approximately 1.5 mm and is situated at a distance 10 of approximately 10 to 20 mm, for example approximately 12 mm, from the bottom of the cavity 1. The bulb 7 is preferably made of quartz. The bulb has an outer radius $r_B$. The radius $r_B$ of the bulb is preferably slightly smaller than the radius r of the substantially cylindrical space formed by the electrodes 4, for example approximately 2 mm smaller, or less. The bulb 7 is disposed within this substantially cylindrical space formed by the electrodes 4 such that there is a radial interstice $e_i$ (not indicated in the figures) between the electrodes 4 and the storage bulb 7, in particular between the outside of the wall of the bulb 7 and the inside of the electrodes 4. This radial interstice $e_i$ corresponds to the difference between the radius r of the substantially cylindrical space formed by the electrodes 4 and the radius $r_B$ of the storage bulb: $e_i = r - r_B$.

Table 1 gives by way of example a set of geometrical parameters of the magnetron cavity 1 such that the resonance frequency $v_c$ of the cavity at a reference temperature of 20° C. is the required resonance frequency, in particular 1420.406 MHz. It is understood that other sets of parameters are possible in order to achieve this frequency. These values correspond to a magnetron cavity 1 made of copper and a storage bulb 7 made of quartz with a dielectric constant $e_r = 3.78 \pm 0.08$ and a thermal expansion coefficient $\alpha_{quartz} = 0.40 \pm 0.03 \cdot 10^{-6}$ C.$^{-1}$, the thermal expansion coefficient for copper being $\alpha_{CO} = 16.5 \pm 0.5 \cdot 10^{-6}$ C.$^{-1}$. An initial value of said radial interstice $e_i$ can be deduced from these parameters. The elements of the magnetron cavity 1 are preferably machined with a mechanical tolerance of 0.1 mm.

TABLE 1

| example of a set of geometrical parameters of a magnetron cavity as represented in FIGS. 1A and 1B: | |
| --- | --- |
| Parameters | Value (mm) |
| Internal diameter 3 of the cavity | 100.1 |
| Height 2 of the cavity | 113.6 |
| Radius r | 29.7 |
| Height 6 of the electrodes | 80.0 |
| Thickness 12 of the electrodes | 4.0 |
| Distance 9 of the electrodes from the bottom of the cavity | 12.0 |
| Circumferential distance $t_{gap}$ | 4.9 |
| Radius of the bulb $r_B$ | 59.0 |
| Height 8 of the bulb | 80.0 |
| Thickness 11 of the wall of the bulb | 1.5 |
| Distance 10 of the bulb from the bottom of the cavity | 12.0 |

FIG. 2 represents a diagram of a preferred embodiment of a computer-assisted method according to a first aspect of the invention for the dimensioning of a magnetron cavity of FIG. 1A. In a first step A) of the method, a set of geometrical parameters is obtained. This set of parameters can for example comprise the parameters of Table 1 or a different set of geometrical parameters, and the thermal expansion coefficients and/or the dielectric constants of the materials used. These geometrical parameters, and a reference temperature $T_0$, for example a temperature of 20° C., and an initial value $e_{i0}$ of the radial interstice $e_i$ can be introduced into a computer program intended to determine a potential geometrical deformation of the cavity and determine the resonance frequency associated with said deformation, for example in a finite elements modelling program, for example in Comsol® Multiphysics, or in any other appropriate program. This set of geometrical parameters, for example the set of Table 1 or any other set of geometrical parameters, is chosen such that the resonance frequency $v_c$ of the cavity at the reference temperature is the resonance frequency required for a hydrogen maser, in particular 1420.406 MHz+/-1. It is preferable to adjust only the circumferential distance $t_{gap}$ between two adjacent electrodes of the at least two curved electrodes of the magnetron cavity in order to obtain this required resonance frequency. Additionally, or alternatively, it is possible to act on the height 2 of the cavity.

Then, in a second step B) of the method, the reference temperature $T_0$ can be modified, for example by adding an interval $\varepsilon_j$ set on each iteration, for example of 10° C. or of 5° C., or of 1° C., or any other appropriate interval. It is also possible to modify $T_0$ by a variable or even random interval. The set of the n (n being a strictly positive integer number) modified temperatures $T_j$ preferably covers a range of potential operating temperatures of the magnetron cavity, for example between approximately 5° C. and approximately 50° C. For this set of modified parameters $T_j$, the step B) comprises the determination of a potential geometrical deformation of the cavity induced by the thermal expansion due to this modified temperature which can comprise a raising or lowering of the reference temperature by considering the thermal expansion parameters of the material or materials, for example of copper for the magnetron cavity 1 and the electrodes 4 and of quartz for the storage bulb 7. This step can for example be performed by displacing a meshing according to three right-angled directions in a finite-elements modelling program, for example in an interface of the same program Comsol® Multiphysics as in the step A), or in any other appropriate program. For this meshing, each element, or mesh, is for example a tetrahedron and each mesh point is identified unequivocally in the space by the three coordinates u, v, w. Preferably, the meshing is the smallest possible in order to best simulate the cavity. It is for example noted that the thickness of the wall of the storage bulb can be very thin, for example of the order of 1 mm thick. Thus, it is preferable for the meshes to be smaller than this thickness of the bulb. For each deformed geometry, the method, in particular the step B), comprises the determination of the resonance frequency $v_{cj}$ ($T_j$) associated with this potential geometrical deformation, which is obtained using Maxwell equations, for example by using an appropriate interface of the same computer program as in the step A) or in any other appropriate computer program.

Next, in the step C) of the method, the frequency-temperature coefficient FTC is determined. The FTC corresponds to the variation of the resonance frequency $v_{cj}$ with respect to said plurality of operating temperatures $T_j$. This determination can for example be made by linear regression by a least squares method in any appropriate computer program. FIG. 3 represents a graph illustrating a potential result of this step C) of the method. Each point corresponds to a prediction. The linear regression straight line is also presented. According to this regression straight line, an FTC of 16.5 kHz° C.$^{-1}$ is obtained with the storage bulb. It is also possible to use experimental measurements and it has been proven that the values of the FTC predicted and those resulting from experimental measurements are in very close agreement.

Since the FTC thus obtained is an FTC for a given interstice $e_i$ and since it has been proven that the FTC is very dependent on the value of this interstice $e_i$, the method then comprises the step D) which is the repetition of the steps B) and C) for a plurality of values of this interstice, for example for m different values of the interstice, m being a strictly positive integer number. For each new value of this interstice $e_i$, it is preferable to also redetermine a value for the circumferential distance $t_{gap}$ between two adjacent electrodes 4 in order to obtain the required resonance frequency $v_c$, in particular of 1420.406 MHz+/−1. The result of this step is the obtaining of a plurality of FTC values as a function of the interstice $e_i$ and possibly as a function of a value $t_{gap}$ associated with the interstice $e_i$.

In a last step E) of the method, the radial interstice $e_i$ corresponding to the desired frequency-temperature coefficient (FTC) is determined. This step can comprise a graphical display using an appropriate computer program of the plurality of FTC values as a function of the interstice $e_i$. FIG. 4 represents a graph illustrating this step E) of the method showing the FTC (black squares) as a function of the interstice $e_i$ with radius $r_B$ that is kept constant, all the other geometrical parameters being maintained constant, with the exception of $t_{gap}$ (circles) which has been adapted to each $e_i$ so as to keep the resonance frequency of the cavity within 1 MHz of the frequency of the magnetron cavity for a hydrogen maser which is 1420.406 MHz. This display makes it possible to view the dependency of the FTC of the value of the gap and makes it possible to deduce and therefore determine how to adjust the interstice $e_i$ for a magnetron cavity having an FTC between approximately 60 kHz° C.$^{-1}$ and 0 (but excluding 0), preferably between approximately 30 kHz° C.$^{-1}$ and 0 (but excluding 0), preferably between 20 kHz° C.$^{-1}$ and 0 (excluding 0) to be obtained. It is important to stress that even though this graph was obtained from a set of geometrical parameters of a chosen magnetron cavity, it has been demonstrated that the behaviour of this dependency of the FTC as a function of the value of the interstice $e_i$ does not depend on these geometrical parameters initially chosen. Indeed, for values of the interstice between 0 and 1 mm, the value of the FTC appears to pass very quickly from a relatively high value, such as approximately 70 kHz° C.$^{-1}$ or approximately 60 kHz° C.$^{-1}$ or even approximately 50 kHz° C.$^{-1}$ when the interstice is close to 0 mm (such as between 0.05 and 0.2 mm), to values of the FTC approaching 0 when the value of the interstice rises to 1 mm or above. Therefore, if, for example, a user wants to obtain a magnetron cavity having an FTC of approximately 20 kHz° C.$^{-1}$, the last step E) of the method allows him or her to determine the value of the interstice $e_i$ to be used, in particular $e_i$=approximately 0.4 mm, to correctly dimension a magnetron cavity having the desired FTC. Instead of using a display, this step can also be performed using a table, such as for example Table 2, or by any other appropriate method or computer program.

TABLE 2

| example of the values of the interstice, of the FTC and of the $t_{gap}$ as represented in FIG. 4: | | |
|---|---|---|
| $e_i$ (mm) | FTC (kHz/° C.) | $t_{gap}$ (mm) |
| 0.1 | 69.2 | 4.41 |
| 0.2 | 42.6 | 4.26 |
| 0.3 | 30.4 | 4.16 |
| 0.4 | 22.5 | 4.08 |
| 0.5 | 16.6 | 4.01 |
| 0.6 | 11.8 | 3.95 |
| 0.7 | 7.9 | 3.92 |
| 0.8 | 4.7 | 3.89 |
| 0.9 | 2.0 | 3.87 |
| 1.0 | −0.4 | 3.85 |
| 1.1 | −2.5 | 3.83 |
| 1.2 | −4.4 | 3.82 |

Even though the present invention has been illustrated with reference to specific embodiments, the person skilled in the art will understand that the invention is not limited to the details of the illustrative embodiments, and that the present invention can be produced with numerous modifications without departing from the scope of the invention. The embodiments should be considered as illustrative and not in a restrictive manner, the scope of the invention being defined by the following claims rather than by the preceding description. Any modification which falls within the meaning or the equivalence of the claims is intended to be included. In other words, it is envisaged to cover all the modifications, variations or equivalences which fall under the scope of the basic underlying principles and the essential features of which are claimed in this patent application. The reader of this patent application will understand that the words "comprising" or "comprises" do not preclude any other element or step, and that the words "a" or "one" do not preclude a plurality. The reference symbols in the claims cannot be considered to limit the claim concerned. The terms "first", "second", "third", "a", "b", "c", et cetera, are introduced to distinguish different elements or steps and do not necessarily describe a sequential or chronological order. Likewise, the terms "top", "bottom", "above", "below", et cetera, are introduced for descriptive purposes and not necessarily to designate relative positions. It will be understood that these terms are interchangeable under appropriate conditions and that embodiments of the invention can be operable according to the present invention in other sequences or in orientations which differ from those described or illustrated above.

The invention claimed is:

1. A computer-assisted method for the dimensioning of a magnetron cavity for an atomic clock, in particular for a hydrogen maser, the cavity being substantially cylindrical and including at least two curved electrodes disposed along a circular arc and delimiting a substantially cylindrical space of predetermined radius r, the cavity also including a substantially cylindrical storage bulb of radius $r_B$ disposed in said space such that there is a radial interstice $e_i$ between the at least two electrodes and the storage bulb, the method comprising the steps of:

A) obtaining a set of geometrical parameters of the cavity comprising an initial value of said radial interstice $e_i$, such that the resonance frequency $v_c$ of the cavity at a reference temperature is the required resonance frequency, in particular 1420.406 MHz+/−1 MHz, at said reference temperature;

B) for a plurality of operating temperatures of the clock, determining a potential geometrical deformation of the cavity and determining the resonance frequency associated with said deformation;

C) determining the frequency-temperature coefficient (FTC) corresponding to the variation of the resonance frequency with respect to said plurality of operating temperatures;

D) repeating the steps B) and C) for a plurality of values of said interstice $e_i$ E) determining the radial interstice $e_i$ corresponding to the desired frequency-temperature coefficient (FTC).

2. The method according to claim 1, wherein the plurality of values of said radial interstice $e_i$ is chosen between 0 and 3 mm.

3. The method according to claim 1, wherein the desired frequency-temperature coefficient (FTC) is of the order of approximately 20 kHz° C.$^{-1}$ in absolute value or less.

4. The method according to claim 1, wherein said plurality of operating temperatures of the clock comprises temperatures between approximately 5° C. and 70° C.

5. The method according to claim 1, wherein the set of geometrical parameters of the cavity comprises the radius of the substantially cylindrical cavity, the height of said substantially cylindrical cavity, the height and the thickness of the at least two curved electrodes, the radius of the substantially cylindrical space delimited by said at least two electrodes, the height and the radius of said storage bulb.

6. The method according to claim 1, wherein the step A) comprises a determination of the circumferential distance between two adjacent electrodes of the at least two curved electrodes.

7. The method according to claim 1, wherein the step B) comprises the use of a finite elements method.

8. The method according to claim 1, wherein the step C) comprises a linear regression.

9. A method for manufacturing a magnetron cavity for an atomic clock, in particular for a hydrogen maser, the cavity being substantially cylindrical and including at least two curved electrodes disposed along a circular arc and delimiting a substantially cylindrical space of predetermined radius r, the cavity also including a substantially cylindrical storage bulb of radius $r_B$ disposed in said space such that there is a radial interstice $e_i$ between the at least two electrodes and the storage bulb, the method comprising the steps of:

obtaining the value of said interstice for a desired frequency-temperature coefficient (FTC) by the method according to claim 1;

manufacturing the magnetron cavity having said radial interstice $e_i$ between the at least two electrodes and the storage bulb of the cavity and the set of geometrical parameters for which said interstice has been determined.

10. A magnetron cavity for an atomic clock, in particular for a hydrogen maser, the cavity being substantially cylindrical and including at least two curved electrodes disposed along a circular arc and delimiting a substantially cylindrical space of predetermined radius r, the cavity also including a substantially cylindrical storage bulb of radius $r_B$ disposed in said space such that there is a radial interstice $e_i$ between the at least two electrodes and the storage bulb wherein said interstice lies between approximately 0.1 mm and approximately 2 mm and in that a frequency-temperature coefficient lies between 0 and approximately 70 kHz° C.$^{-1}$ in absolute value;

wherein the dimensions of the cavity have been obtained by a computer-assisted method for the dimensioning of a magnetron cavity for an atomic clock, in particular for a hydrogen maser, the cavity being substantially cylindrical and including at least two curved electrodes disposed along a circular arc and delimiting a substantially cylindrical space of predetermined radius r, the cavity also including a substantially cylindrical storage bulb of radius $r_B$ disposed in said space such that there is a radial interstice $e_i$ between the at least two electrodes and the storage bulb, the method comprising the steps of:

A) obtaining a set of geometrical parameters of the cavity comprising an initial value of said radial interstice $e_i$, such that the resonance frequency $v_c$ of the cavity at a reference temperature is the required resonance frequency, in particular 1420.406 MHz+/−1 MHz, at said reference temperature;

B) for a plurality of operating temperatures of the clock, determining a potential geometrical deformation of the cavity and determining the resonance frequency associated with said deformation;

C) determining the frequency-temperature coefficient (FTC) corresponding to the variation of the resonance frequency with respect to said plurality of operating temperatures;

D) repeating the steps B) and C) for a plurality of values of said interstice $e_i$ E) determining the radial interstice $e_i$ corresponding to the desired frequency-temperature coefficient (FTC).

11. The magnetron cavity according to claim 10, wherein a circumferential distance (tgap) between two adjacent electrodes of the at least two electrodes is adjusted for a resonance frequency of said cavity to lie within 1420.406 MHz+/−1 MHz.

12. The magnetron cavity according to claim 10, wherein the magnetron cavity is a compact cavity having a diameter of at most 200 mm.

13. The magnetron cavity according to claim 10, wherein the at least two electrodes are made of the same material as the substantially cylindrical cavity, including copper, aluminum or silver-plated aluminum.

14. An atomic clock of hydrogen maser type comprising a magnetron cavity according to claim 10.

\* \* \* \* \*